US009812189B2

(12) United States Patent
Kolar et al.

(10) Patent No.: US 9,812,189 B2
(45) Date of Patent: Nov. 7, 2017

(54) READ AND WRITE APPARATUS AND METHOD FOR A DUAL PORT MEMORY

(71) Applicant: Intel Corporation, Santa Clara, CA (US)

(72) Inventors: Pramod Kolar, Hillsboro, OR (US); Wei-Hsiang Ma, Portland, OR (US); Gunjan H. Pandya, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/731,319

(22) Filed: Jun. 4, 2015

(65) Prior Publication Data

US 2016/0358643 A1     Dec. 8, 2016

(51) Int. Cl.
| | |
|---|---|
| *G11C 11/00* | (2006.01) |
| *G11C 11/419* | (2006.01) |
| *G11C 8/14* | (2006.01) |
| *G11C 8/16* | (2006.01) |
| *G11C 11/418* | (2006.01) |

(52) U.S. Cl.
CPC .............. *G11C 11/419* (2013.01); *G11C 8/14* (2013.01); *G11C 8/16* (2013.01); *G11C 11/418* (2013.01)

(58) Field of Classification Search
USPC ......... 365/154, 156, 189.04, 189.08, 189.15, 365/189.16, 230.05, 233.1
See application file for complete search history.

(56) References Cited

U.S. PATENT DOCUMENTS

| | | | |
|---|---|---|---|
| 6,233,197 B1 * | 5/2001 | Agrawal .................. | G11C 7/18 365/230.05 |
| 6,333,872 B1 * | 12/2001 | Ouellette ............... | G11C 29/14 365/230.05 |
| 6,370,078 B1 * | 4/2002 | Wik ......................... | G11C 8/16 365/230.05 |
| 6,909,663 B1 * | 6/2005 | Vernenker ............... | G11C 8/16 365/230.05 |
| 7,260,018 B2 * | 8/2007 | Nii .......................... | G11C 8/10 365/154 |
| 7,414,913 B1 * | 8/2008 | Fenstermaker ........ | G11O 5/025 365/230.05 |
| 7,533,222 B2 | 5/2009 | Leung | |
| 7,940,599 B2 | 5/2011 | Lu et al. | |
| 8,295,099 B1 * | 10/2012 | Yachareni ............... | G11C 8/16 365/189.04 |
| 8,356,202 B2 * | 1/2013 | Damaraju ........... | G06F 9/30141 365/189.04 |
| 8,411,479 B2 * | 4/2013 | Lee ........................ | G11C 5/063 365/230.05 |
| 8,531,907 B2 | 9/2013 | Ostermayr et al. | |

(Continued)

OTHER PUBLICATIONS

International Search Report and Written Opinion for International Patent Application No. PCT/US2016/030417, mailed on Sep. 2, 2016.

*Primary Examiner* — Vu Le

(74) *Attorney, Agent, or Firm* — Green, Howard & Mughal, LLP

(57) ABSTRACT

An apparatus is provided which comprises: a memory array; first logic to detect whether first and second word-lines (WL) for a row of the memory array are active; and second logic to deactivate one of the first and second WLs such that one of the first and second WLs is active for the row.

19 Claims, 8 Drawing Sheets

(56) References Cited

U.S. PATENT DOCUMENTS

| | | | |
|---|---|---|---|
| 8,665,636 B2* | 3/2014 | Fukuda | G11C 7/222 |
| | | | 365/154 |
| 9,208,853 B2* | 12/2015 | Kolar | G11C 11/412 |
| 9,208,858 B1* | 12/2015 | Lin | G11C 11/419 |
| 2008/0316851 A1 | 12/2008 | Kinoshita et al. | |
| 2013/0094313 A1 | 4/2013 | Sullivan et al. | |
| 2014/0185367 A1* | 7/2014 | Ngo | G11C 11/419 |
| | | | 365/154 |

* cited by examiner

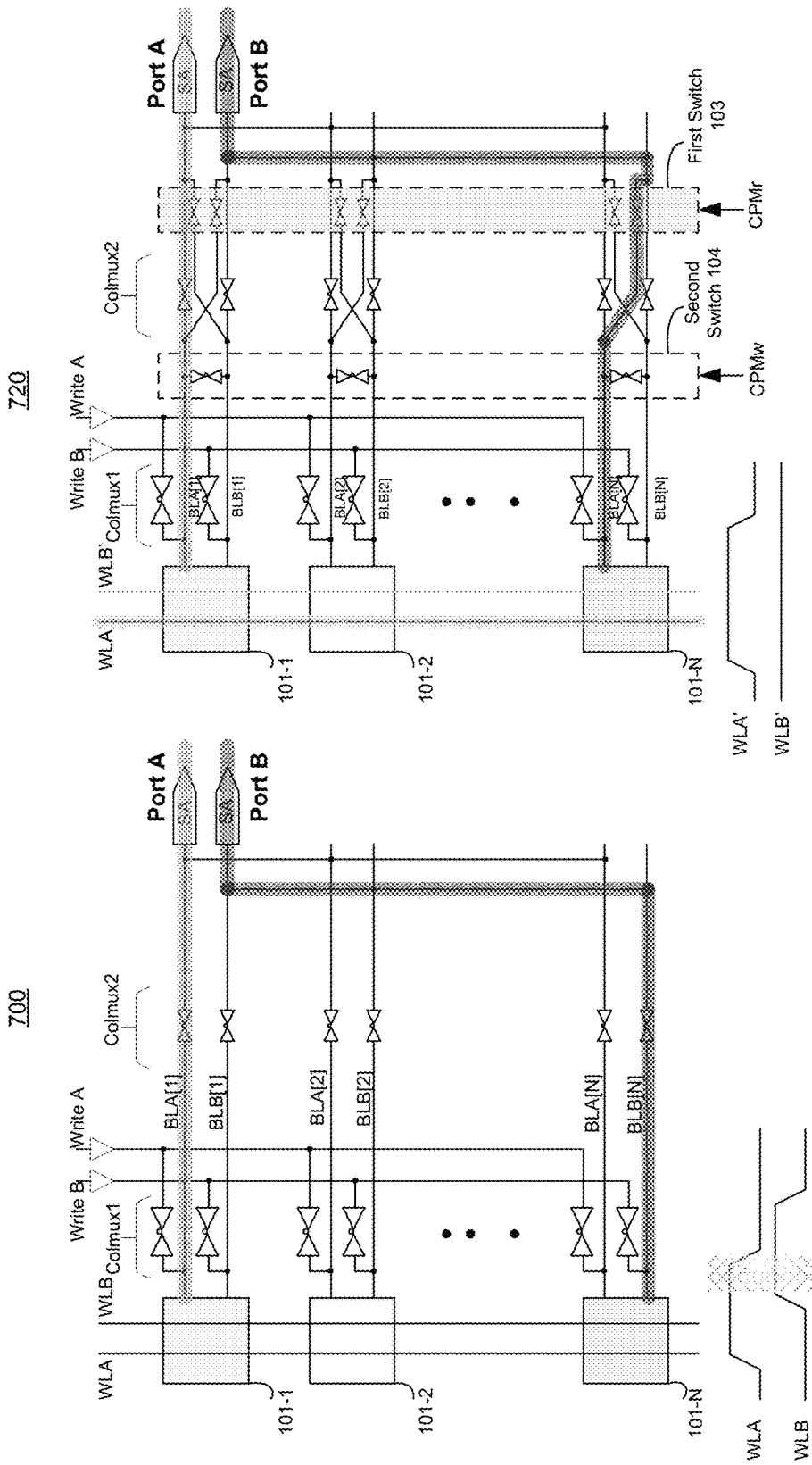

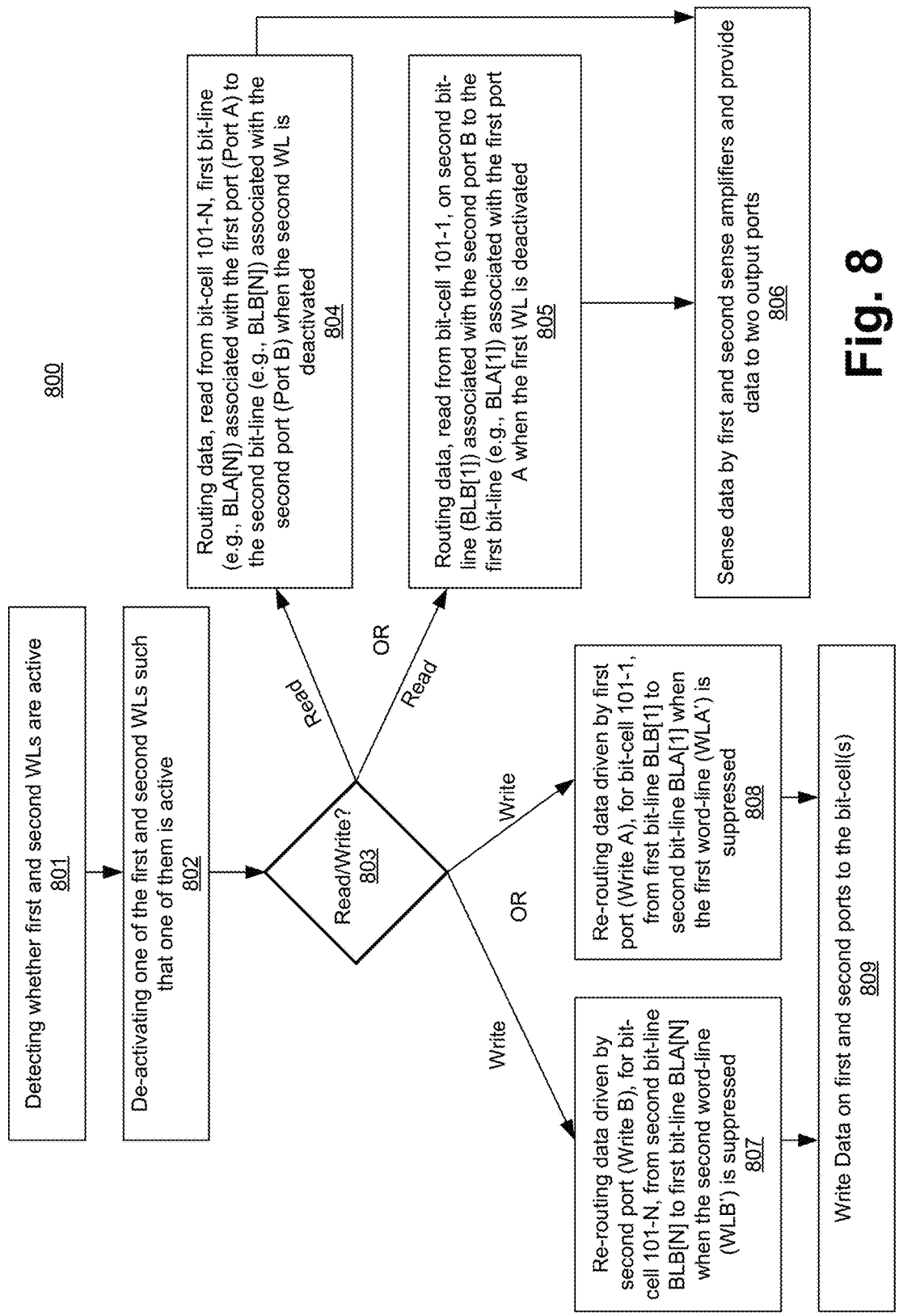

READ AND WRITE APPARATUS AND METHOD FOR A DUAL PORT MEMORY

BACKGROUND

Dual-Port Static Random Access Memory (DP-SRAM) provides more bandwidth than single-port SRAM (SP-SRAM) because DP-SRAM provides for at least two independent ports for addressing the same bit-cell in the SRAM. As such, the same bit-cell can be simultaneously read by the two different ports, and two different bit-cells in a same row of the DP-SRAM array can be written to with different data. Because of having more bandwidth, the demand for DP-SRAM is increasing relative to the demand for SP-SRAM. However, DP-SRAM presents its own challenges, which may not exist in the SP-SRAM.

For example, during normal dual port operation, two word-lines (WLs) of a row or column of the DP-SRAM can be simultaneously activated (i.e., turned on) and may cause a read or write failure in the bit-cells of that row or column. This failure is traditionally referred to as the "disturb issue." The disturb issue reduces the read and writes margins of the DP-SRAM. The disturb issue also increases the minimum operating voltage of the DP-SRAM (Vmin).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 7A illustrates a typical DP-SRAM during a dual read operation that causes the disturb issue.

FIG. 7B illustrates a part of DP-SRAM of FIG. 5 during a read write operation that mitigates the disturb issue, according to some embodiments.

FIG. 8 illustrates a flowchart of a method for dual read and dual write operations such that the disturb issue is mitigated, according to some embodiments of the disclosure.

DETAILED DESCRIPTION

Figure 1:
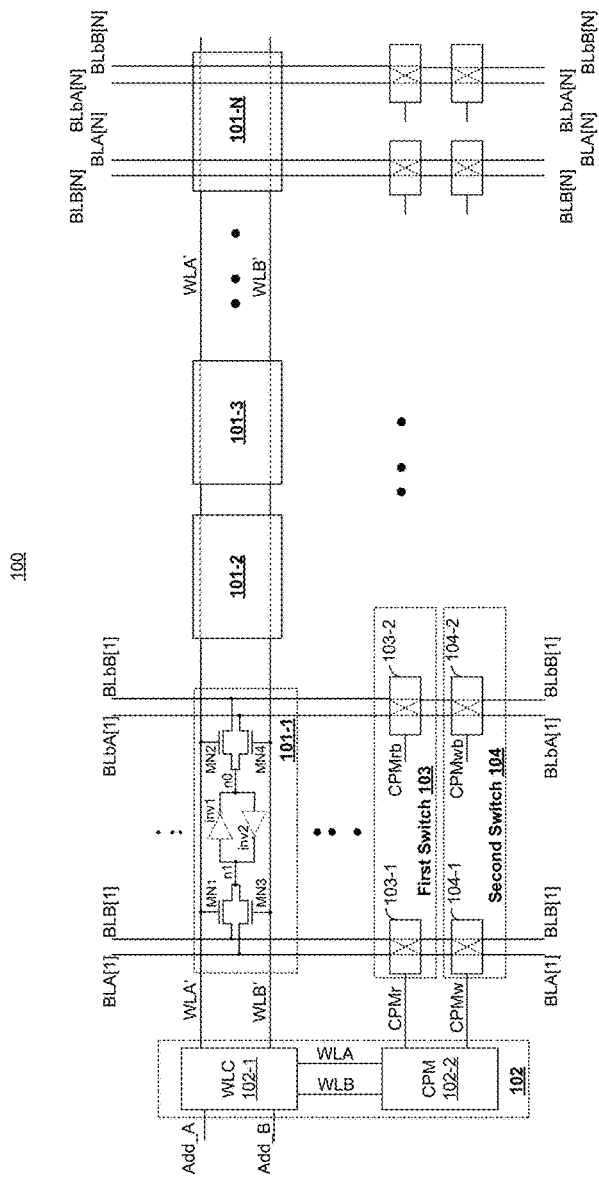
FIG. 1 illustrates a dual port static random access memory (DP-SRAM) which is operable to mitigate the disturb issue, according to some embodiments of the disclosure.

Some embodiments describe a dual port memory architecture that mitigates the disturb issue by monitoring the addresses (for accessing the memory) and determining whether those addresses are for the same row in an array of the dual port memory. In some embodiments, upon determining that the same row is going to be addressed (i.e., read from or written to), logic is provided for determining whether the word-lines for those addresses will have signals on them which overlap each other for at least a duration of time. In some embodiments, the signal on the word-line which arrives later is suppressed while the pulse width of the signal on the word-line that arrives early is extended. As such, one of the overlapped word-line is active while the other overlapped word-line is deactivated (i.e., suppressed).

Here, node names and signal names are interchangeably used. For example, the term "word-line" may refer to the word-line node or signal on that word-line node depending on the context of the sentence. In another example, overlapped word-line may refer to a signal of that word-line which has a pulse width that at least partially overlaps in time with the pulse width of another signal of another word-line.

In some embodiments, logic is provided to forward data to the appropriate ports to ensure correct read and/or write operations. For example, during read operation, if one of the word-lines is suppressed (i.e., deactivated), then data that was supposed to be read out using the now suppressed word-line is retrieved from the bit-cell using the active word-line. The retrieved data is then forwarded to the port that expected that data to begin with. As such, from an external point of view (e.g., from the output of the sense amplifiers providing data to read ports), data is provided on correct ports (by switching data from one bit-line to another) even though the word-line associated with one of the ports is suppressed.

In some embodiments, during write operation for a target bit-cell, when one of the word-line is suppressed, data is written to the target bit-cell using the active word-line. For example, data for writing which is provided to a first port is forwarded to a bit-line associated with a second port. The following embodiments are described with reference to an eight transistor dual port static random access memory (8T DP SRAM). However, various embodiments can be extended to other types of DP memory bit-cells. For example, various embodiments for mitigating the disturb issue are applicable to DP register files.

There are many technical effects of various embodiments. For example, the disturb issue is mitigated and/or eliminated altogether without having to change the size of the bit-cell. The logic used for controlling the word-line (e.g., for suppressing a word-line and extending the pulse width of an active word-line), and logic for cross-port mapping (e.g., for re-routing bit-lines associated with a bit-cell) are outside the memory array and can be applied for both read and write operations for synchronous and asynchronous designs. Other technical effects will be evident from the various embodiments described here.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, eFET, etc., may be used without departing from the scope of the disclosure.

FIG. 1 illustrates DP-SRAM architecture 100 which is operable to mitigate the disturb issue, according to some embodiments of the disclosure. DP-SRAM architecture 100 comprises an array of memory bit-cells, logic 102 for controlling word-line and cross-port mapping, First Switch 103, and Second Switch 104. So as not to obscure the various embodiments, one row of the DP-SRAM bit-cells is shown. The row includes bit-cells 101-1 through 101-N, where 'N' is an integer greater than one.

In some embodiments, bit-cell 101-1 is an 8T DP-SRAM bit-cell having n-type transistors MN1, MN2, MN3, MN4 and inverters inv1 and inv2. Transistors MN1, MN2, MN3, and MN4 are access transistors while inverters inv1 and inv2 are cross-coupled inverters. The source/drain terminals of transistors MN1 and MN3 are coupled to node n1 while the source/drain terminals of transistors MN2 and MN4 are coupled to node n0 as shown. While various embodiments are described with reference to n-type access transistors, p-type access transistors can be used and logic controlling those p-type access transistors can be modified accordingly.

In some embodiments, the gate terminals of transistors MN1 and MN2 of bit-cell 101-1 are controlled by a first word-line WLA' (also referred to as WLA'[1]) which is a word-line generated by logic 102. In some embodiments, the gate terminals of transistors MN3 and MN4 of bit-cell 101-1 are controlled by a second word-line WLB' (also referred to as WLB'[1]) which is a word-line generated by logic 102. A row of memory bit-cells shares the same first and second word-lines. For example, memory bit-cells 101-1 through 101-N in the same row (or column for some memory array arrangements) share the first word-line WLA' and the second word-line WLB'.

In some embodiments, the drain/source terminal of transistor MN3 of bit-cell 101-1 is coupled to a first bit-line (BLA[1]) while the drain/source terminal of transistor MN1 of bit-cell 101-1 is coupled to a second bit-line (BLB[1]). In some embodiments, the drain/source terminal of transistor MN4 of bit-cell 101-1 is coupled to a complement of the first bit-line (BLbA[1]) while the drain/source terminal of transistor MN2 of bit-cell 101-1 is coupled to a complement of the second bit-line (BLbB[1]). Here, a complement of a signal is the inverse of that signal. For example, a complement of bit-line is an inverse of that bit-line. To access a bit-cell, a word-line and a bit-line is selected (i.e., activated).

In some embodiments, each bit-cell receives at least two bit-lines and their respective complements, where each bit-line (and its complement) is associated with a port. For example, bit-lines BLA[1] and BLbA[1] are associated with a first port (also referred to as the first read port or a first write port depending on the memory architecture), and bit-lines BLB[1] and BLbB[1] are associated with a second port (also referred to as the second read port or second write port depending on the memory architecture). In some embodiments, for 'N' bit-cells there are 4N bit-lines. For example, bit-cell 101-2 receives bit-lines BLA[1], BLbA[1], BLB[1], and BLbB[1] (not shown), and bit-cell 101-N receives bit-lines BLA[N], BLbA[N], BLB[N], and BLbB[N].

In typical DP-SRAMs, during normal dual port operation, two word-lines of a same row of the DP-SRAM bit-cells can be simultaneously activated (i.e., turned on) and may cause a read or write failure in the selected bit-cell (which is selected according to the activated bit-line) or neighboring bit-cells of the same row. This failure is the disturb issue which reduces the read and writes margins of the DP-SRAM. Some embodiments mitigate this disturb issue by suppressing one of the at least two word-lines in the row which overlap each other for at least some duration of time.

In some embodiments, word-line control (WLC) logic 102-1 compares addresses (e.g., Add_A and Add_B) and determines whether the same row is being accessed for write/read operation. In some embodiments, WLC logic 102-1 generates dual word-line signals (or word-lines) WLA and WLB which are then manipulated depending on whether the dual word-lines overlap over a duration of time. In some embodiments, WLC logic 102-1 determines whether there is an overlap between the pulses of the dual word-lines. In some embodiments, WLC logic 102-1 extends the pulse width of the early arriving word-line and suppresses the later arriving word-line (i.e., deactivates the later arriving word-line) when a same row of the memory array is being accessed and when there is an overlap between the dual word-lines. The manipulated word-lines, WLA' and WLB', are then provided to the addressed row of the memory array. When a word-line is suppressed or deactivated, the transistors controlled by that word-line are turned off.

In some embodiments, cross-port logic (CPM) 102-2 generates control signals CPMr and CPMw (and their complements CPMrb and CPMwb) depending on read or write operations, respectively. In some embodiments, CPMr is generated to control First Switch 103. In some embodiments, CPMw is generated to control Second Switch 104. In some embodiments, First and Second Switches 103 and 104, respectively, are multiplexers, pass-gates, or other types of selection circuits. In some embodiments, First Switch 103 comprises a pair of switches 103-1 and 103-2, where switch 103-1 is operable to cross route bit-lines BLA[1] and BLB[1] according to the logic state of CPMr while switch 103-2 is operable to cross route bit-lines BLbA[1] and BLbB[1] according to the logic state of CPMrb. In some embodiments, Second Switch 104 comprises a pair of switches 104-1 and 104-2, where switch 104-1 is operable to cross route bit-lines BLA[1] and BLB[1] according to the logic state of CPMw while switch 104-2 is operable to cross route bit-lines BLbA[1] and BLbB[1] according to the logic state of CPMwb.

In some embodiments, when one of the word-lines is suppressed (i.e., deactivated) and write operation is being performed, then CPM logic 102-2 activates CPMw and deactivates CPMr. For example, CPM logic 102-2 turns on CPMw to cause Second Switch 104 to cross route the bit-lines while First Switch 103 continues to pass through the bit-lines (i.e., allow the signals on the bit-lines to flow through) without cross routing them. In some embodiments, when one of the word-lines is suppressed (i.e., deactivated or grounded) and read operation is being performed, then CPM logic 102-2 activates CPMr and deactivates CPMw. For example, CPM logic 102-2 turns on CPMr to cause First Switch 103 to cross route the bit-lines while Second Switch 104 continues to pass through the bit-lines without cross routing them. The operation of First and Second Switches 103 and 104, respectively, are described with reference to FIGS. 5-7, according to some embodiments.

Figure 2:
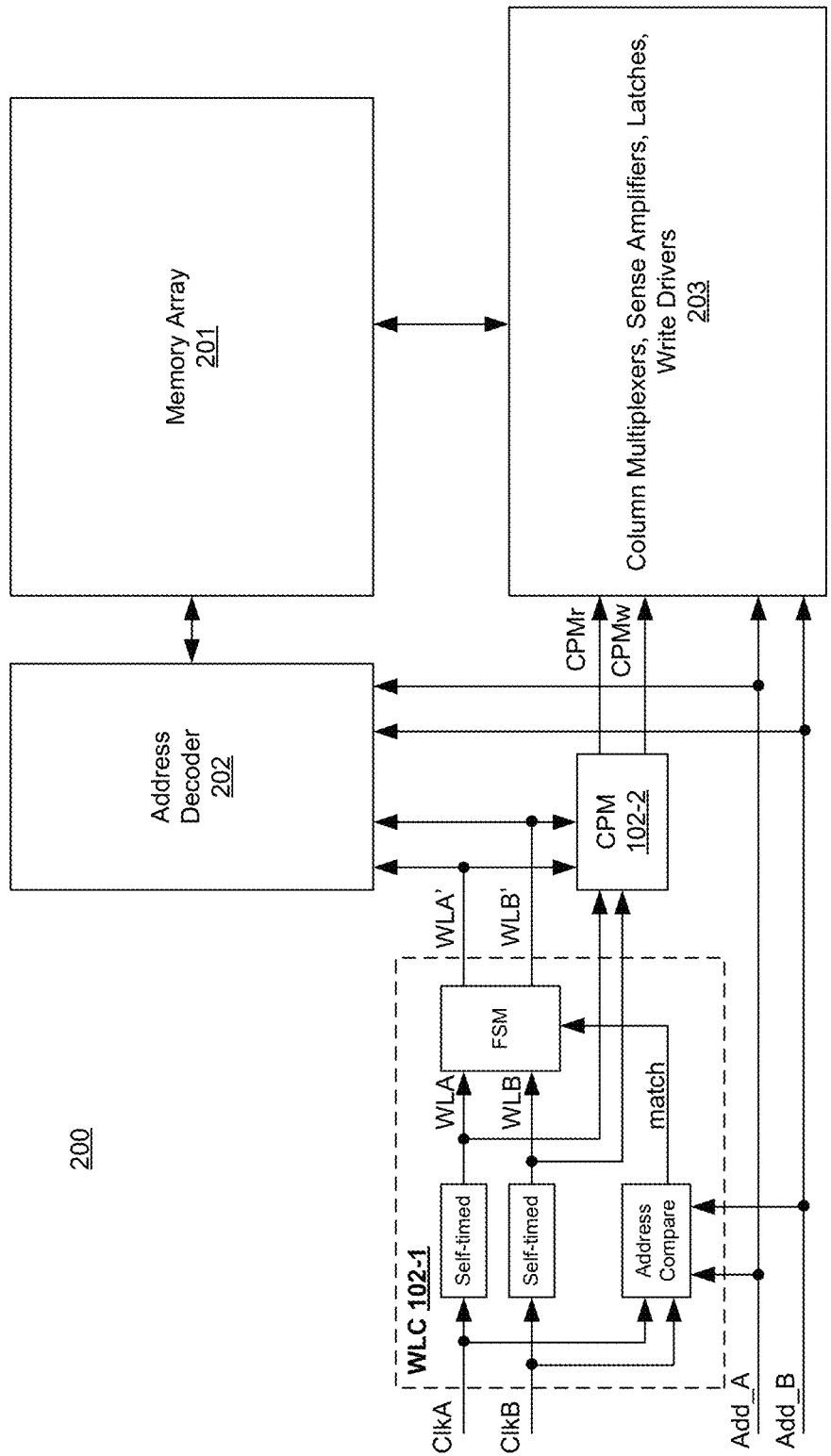
FIG. 2 illustrates a memory architecture with word-line control (WLC) and cross-port mapping (CPM) logic to mitigate the disturb issue, according to some embodiments of the disclosure.

FIG. 2 illustrates memory architecture 200 with WLC and CPM logics to mitigate the disturb issue, according to some embodiments of the disclosure. It is pointed out that those elements of FIG. 2 having the same reference numbers (or names) as the elements of any other figure can operate or function in any manner similar to that described, but are not limited to such.

In some embodiments, memory architecture 200 comprises Memory Array 201, Address Decoder 202, Column Multiplexers, Sense Amplifiers, Latches, and Write Drivers (collectively labeled as 203), WLC logic 102-1 and CPM logic 102-2. In some embodiments, WLC 102-1 receives clock signals ClkA and ClkB and address signals Add_A and Add_B and generates word-lines WLA and WLB, and their modified word-line versions WLA' and WLB'. In some embodiments, WLC 102-1 comprises Self-timed logic, Finite State Machine (FSM), and Address Compare logic.

In some embodiments, the Self-timed logic receives clock signals ClkA and ClkB and generates the two pulsed word-lines WLA and WLB. In some embodiments, the Self-timed logic generates the two pulsed word-lines WLA and WLB asynchronously once addresses Add_A and Add_B are received. In some embodiments, the FSM receives the pulsed word-lines WLA and WLB, and depending on the output "match" of the Address Compare logic, the FSM modifies the word-lines and generates word-lines WLA' and WLB'. In some embodiments, the Address Compare logic determines whether the addresses to the memory refer to the same row.

In some embodiments, when the signal "match" asserts (i.e., when the Address Compare logic determines that the same row in the memory array is being accessed), the FSM suppresses one of the word-lines, which arrived later compared to the other word-line, to generate word-lines WLA' and WLB'. For example, if word-line WLB arrives after word-line WLA (i.e., the first rising/falling edge of word-line WLA pulse is before the first rising/falling edge of word-line WLB) then the FSM suppresses word-line WLB and extends the pulse width of WLA.

In some embodiments, CPM logic 102-2 receives the modified word-lines WLA' and WLB', and depending on whether the operation is a read or write operation, CPMr and CPMw logic states are determined. For example, when one of the word-lines is suppressed (i.e., deactivated) and a write operation is being performed, then CPM logic 102-2 activates CPMw and deactivates CPMr. In another example, when one of the word-lines is suppressed (i.e., deactivated) and read operation is being performed, then CPM logic 102-2 activates CPMr and deactivates CPMw.

In some embodiments, Address Decoder 202 receives the addresses Add_A and Add_B along with the modified word-lines WLA' and WLB' to provide the word-lines to the selected row in Memory Array 201. In some embodiments, address signals Add_A and Add_B are used to control Column Multiplexers 203 to select the bit-cell(s) from Memory Array 201 for the selected row. In some embodiments, Write Drivers 203 are used to drive the to-be written data (from, for example, write ports) to bit-cells via bit-lines. In some embodiments, data which is read from the bit-cells and provided over the bit-lines to Sense Amplifiers 203 is then provided to at least two read ports of the dual port memory architecture.

Figure 3:
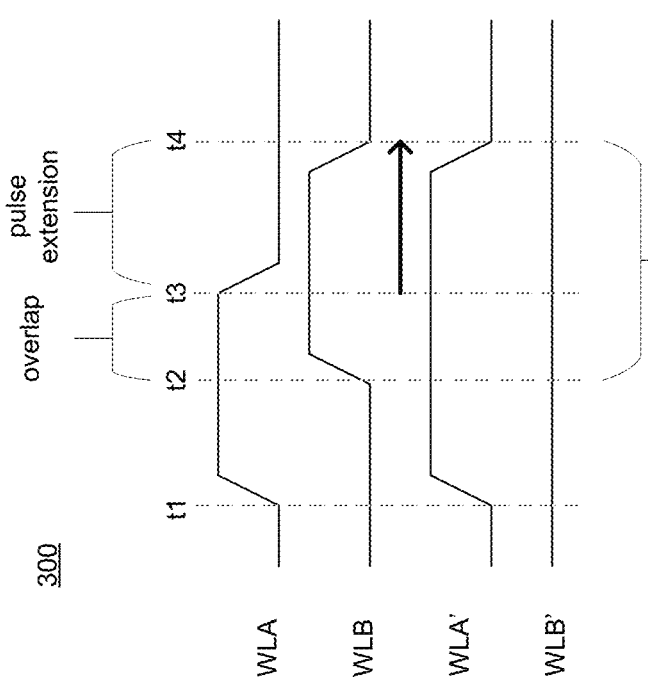
FIG. 3 illustrates a timing diagram of WLC and CPM logic when signals on the word-lines overlap, according to some embodiments of the disclosure.

FIG. 3 illustrates timing diagram 300 of WLC and CPM logics 102-1 and 102-2, respectively, when signals on the word-lines overlap for the same row of the memory array, according to some embodiments of the disclosure. It is pointed out that those elements of FIG. 3 having the same reference numbers (or names) as the elements of any other figure can operate or function in any manner similar to that described, but are not limited to such. Here, x-axis is time and y-axis is voltage for each waveform.

At time t1, word-line WLA asserts and at time t3 word-line WLB asserts, while at time t2 word-line WLA de-asserts and at time t4 word-line WLB de-asserts. During times t2 and t3, word-line WLA overlaps with word-line WLB. In this example, word-line WLB arrives after word-line WLA and there is a partial overlap of the word-lines (see "overlap" in FIG. 3). As such, the FSM of WLC logic 102-1 generates modified word-line WLA' by extending its pulse width (see "pulse extension" in FIG. 3).

In some embodiments, the pulse width of word-line WLA' is extended to the falling edge of word-line WLB while word-line WLA' begins at t1. For example, pulse width of word-line WLA' is extended by time duration t4 minus t3 to provide suitable time for cross-port mapping. In this case, word-line WLB' is suppressed to turn off the access devices it is coupled to (i.e., word-line WLB' is deactivated). As such any disturb on the bit-lines is mitigated because one of the word-lines for that row is suppressed.

During the time between t4 and t3, CPM logic 102-2 is activated which sets the logic states of CPMr and CPMw signals according to whether a read or write operation is being performed. If a read operation is being performed, CPM logic 102-2 turns on CPMr and turns off CPMw (i.e., the logic state of CPMr is set to cause First Switch 103 to perform cross-port mapping by routing a bit-line of one port to a bit-line of another port, while the logic state of CPMw is set to cause Second Switch 104 to pass on the bit-lines to their respective ports without re-routing them to other bit-lines).

Figure 4:
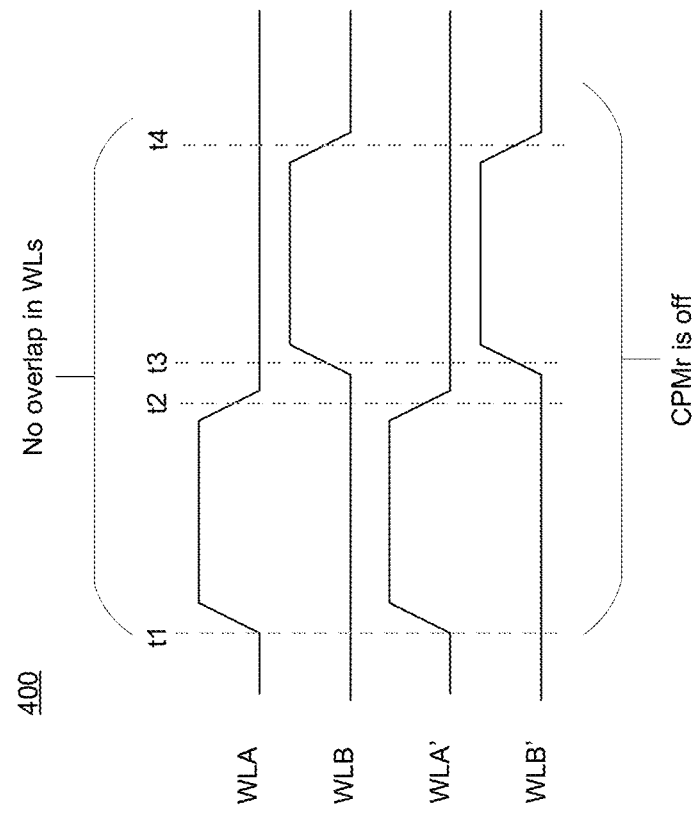
FIG. 4 illustrates a timing diagram of WLC and CPM logic when signals on the word-lines do not overlap, according to some embodiments of the disclosure.

FIG. 4 illustrates timing diagram 400 of WLC and CPM logics 102-1 and 102-2, respectively, when signals on the word-lines do not overlap for the same row of the memory array, according to some embodiments of the disclosure. It is pointed out that those elements of FIG. 4 having the same reference numbers (or names) as the elements of any other figure can operate or function in any manner similar to that described, but are not limited to such. Here, x-axis is time and y-axis is voltage for each waveform.

At time t1, word-line WLA asserts and at time t3 word-line WLB asserts, while at time t2 word-line WLA de-asserts and at time t4 word-line WLB de-asserts. Like FIG. 3, in this example, word-line WLA asserts before word-line WLB asserts. However, unlike FIG. 3, during times t2 and t3, word-line WLA does not overlap with word-line WLB (see "No overlap in WLs" in FIG. 4). In the absence of overlap, WLC logic 102-1 does not extend the pulse width of word-line WLA'. In this case, word-lines WLA' and WLB' are the same as word-lines WLA and WLB, respectively. In one such embodiment, CPM logic 102-2 deactivates signals CPMr and CPMw to disable any cross-port mapping (See "CPMr is off" in FIG. 4). For example, First and Second Switches 103 and 104, respectively, are transparent when signals CPMr and CPMw are disabled (i.e., First and Second Switches 103 and 104, respectively, do not cross-couple the bit-lines).

Figure 5:
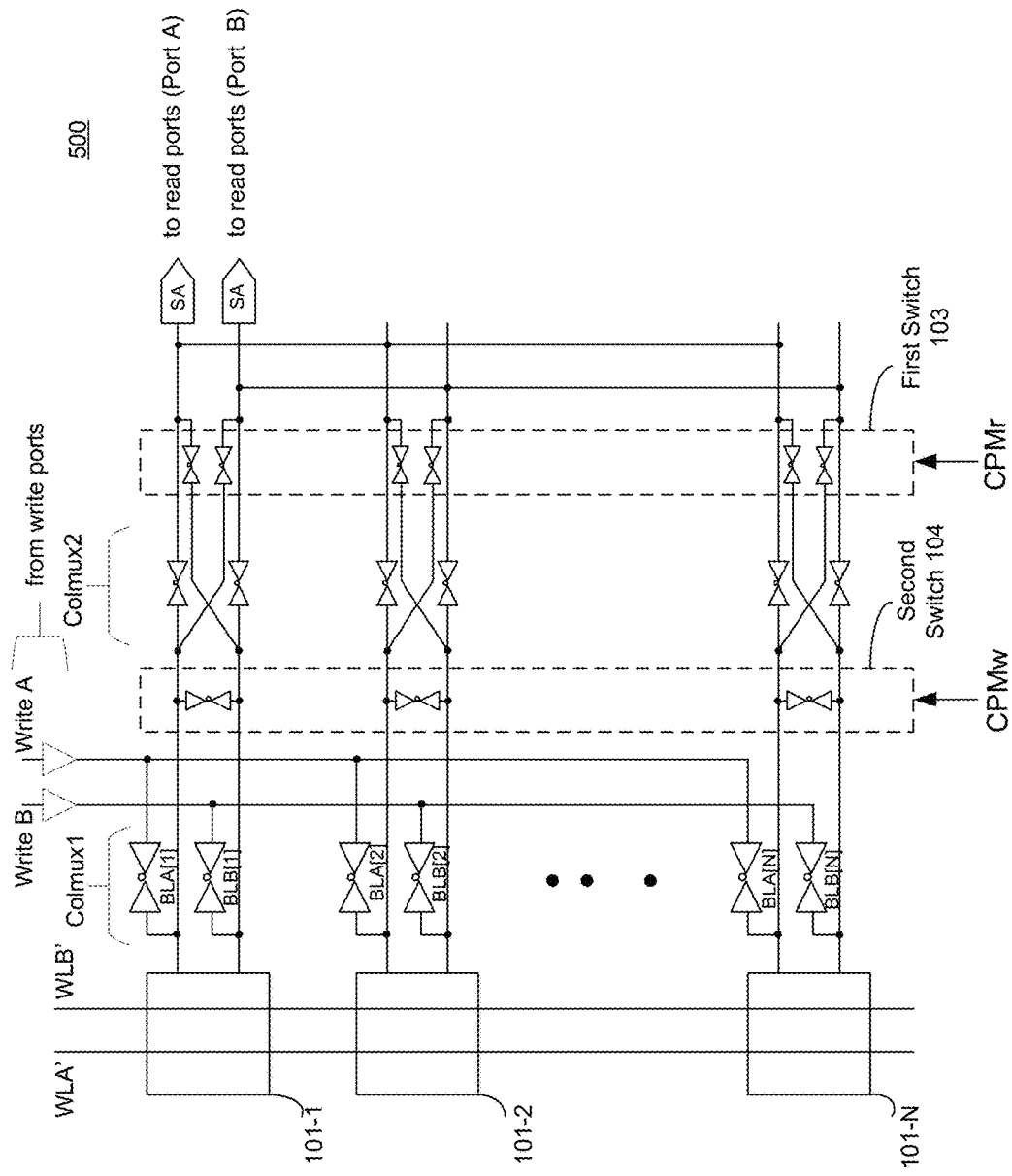
FIG. 5 illustrates a part of DP-SRAM with first and second switches which are operable to mitigate the disturb issue, according to some embodiments of the disclosure.

FIG. 5 illustrates a part of DP-SRAM 500 with First and Second Switches 103 and 104, respectively, which are operable to mitigate the disturb issue, according to some embodiments of the disclosure. It is pointed out that those elements of FIG. 5 having the same reference numbers (or names) as the elements of any other figure can operate or function in any manner similar to that described, but are not limited to such. FIG. 5 is similar to FIG. 1 except that logic 102 is not shown and other details such as Column Multiplexers 203 (e.g., Colmux1 and Colmux2) and First and Second Switches 103 and 104 are shown to illustrate the operation of DP-SRAM 500.

Colmux1 and Colmux2 may be implemented as pass-gates (or other types of selection circuits) that are controllable by column select signals (not shown). Colmux1 and Colmux2 operate like any known memory column multiplexers in dual port memories. Data for writing to the memory cells is provided by Write Drivers (shown as buffers) that receive the data from Write Ports—Write A and Write B. Data read from the memory cells is provided by read ports—Port A and Port B—after being sensed by Sense Amplifiers (SAs).

In some embodiments, First Switch 103 comprises selection circuits such as pass-gates (or multiplexers) that are operable to couple a bit-line associated with one read port to a bit-line associated with another read port when CPMr is asserted (i.e., when the logic state of CPMr is set to cause the cross coupling of the bit-lines associated with a bit-cell). For example, First Switch 103 is operable to re-route bit-line BLA[1] to bit-line BLB[1] and from bit-line BLB[1] to bit-line BLA[1] for bit-cell 101-1 according to the logic state of CPMr.

In some embodiments, Second Switch 104 comprises selection circuits such as pass-gates (or multiplexers) that are operable to couple a bit-line associated with one write port (e.g., Write A) to a bit-line associated with another write port (e.g., Write B) when CPMw is asserted (i.e., when the logic state of CPMw is set to cause the cross coupling of the bit-lines). For example, Second Switch 104 is operable to re-route bit-line BLA[1] to bit-line BLB[1] and from bit-line BLB[1] to bit-line BLA[1] for bit-cell 101-1 according to the logic state of CPMw. In some embodiments, Second Switch 104 and First Switch 103 are separated by column multiplexers Colmux2 as shown. The operation of First and Second Switches 103 and 104 are described with reference to FIGS. 6-7.

Figures 6A, 6B:
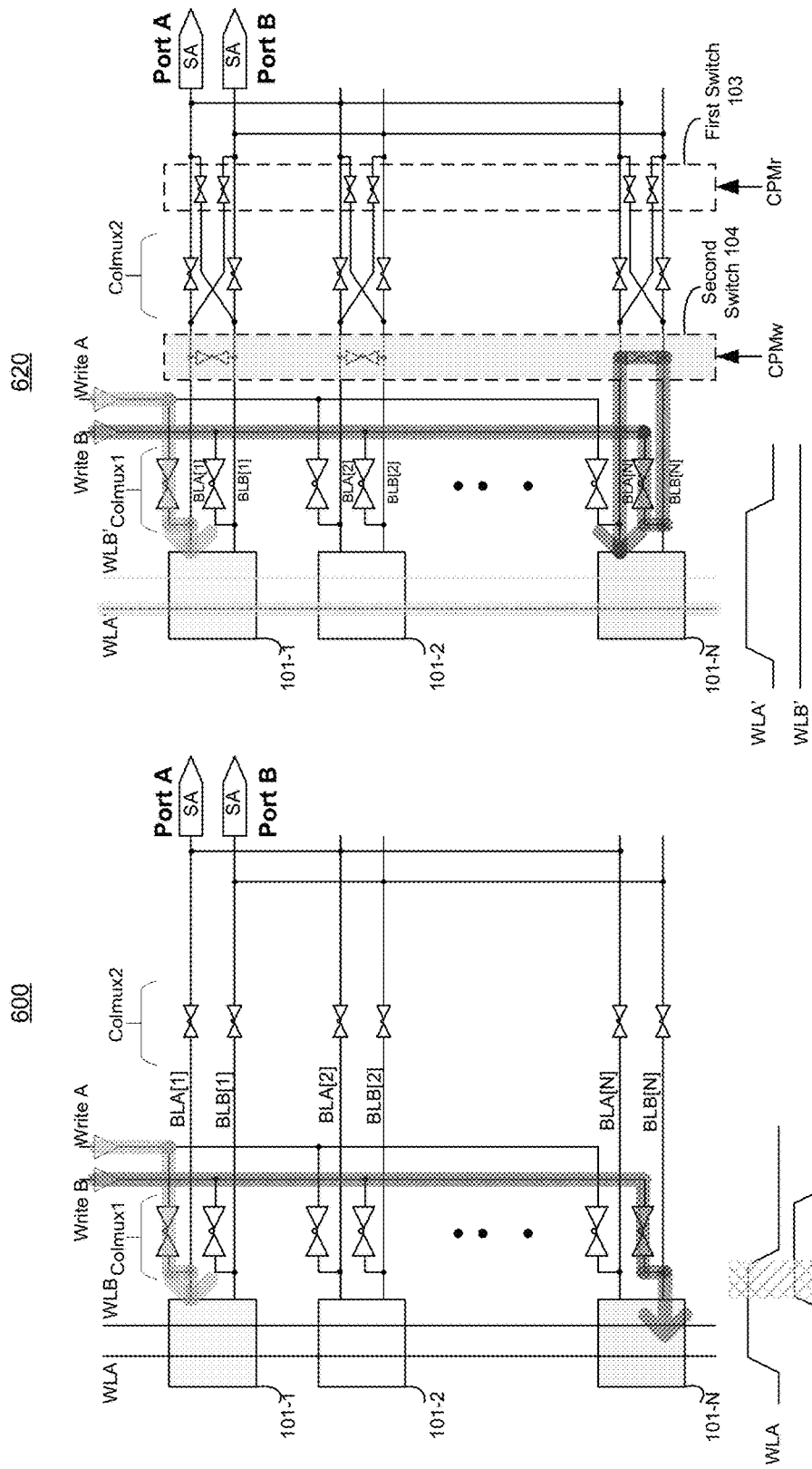
FIG. 6A illustrates a typical DP-SRAM during a dual write operation that causes the disturb issue.
FIG. 6B illustrates a part of DP-SRAM of FIG. 5 during a dual write operation that mitigates the disturb issue, according to some embodiments.

FIG. 6A illustrates a typical DP-SRAM 600 during a dual write operation that causes the disturb issue. It is pointed out that those elements of FIG. 6A having the same reference numbers (or names) as the elements of any other figure can operate or function in any manner similar to that described, but are not limited to such.

In traditional dual port memories (that do not have First and Second Switches and associated logic), during a write operation to the same memory row, both word-lines WLA and WLB are activated (i.e., turned on) for a row and appropriate column multiplexers of Colmux1 are turned on to write data to the selected bit-cells 101-1 and 101-N. In this case, data for writing is provided through write ports A and B (i.e., Write A and Write B).

Here, the two shaded paths (i.e., a light shaded for Write A and a dark shaded for Write B) show the electrical paths for writing data to the two selected bit-cells (i.e., bit-cell 101-1 and 101-N) of a row simultaneously. Since the word-lines WLA and WLB have pulses that overlap for a duration of time, the data being written via Write A and Write B ports can reduce the write margin and disturb data written to other bit-cells in the same row. To mitigate this disturb issue, Second Switch 104 is activated as shown with reference to FIG. 6B, according to some embodiments.

FIG. 6B illustrates a part of DP-SRAM 620 of FIG. 5 during a dual write operation that mitigates the disturb issue, according to some embodiments of the disclosure. It is pointed out that those elements of FIG. 6B having the same reference numbers (or names) as the elements of any other figure can operate or function in any manner similar to that described, but are not limited to such.

In some embodiments, WLC logic 102-1 extends the pulse width of WLA' and suppresses word-line WLB' because word-lines WLA and WLB overlap for the same selected memory row and word-line WLB arrives after word-line WLA. In this example, word-line WLA' is high-lighted indicating activated word-line with extended pulse, while word-line WLB' is suppressed as indicated by the light highlighted word-line WLB'.

In some embodiments, Second Switch 104 is activated (i.e., turned on) because CPMw is activated by CPM logic 102-2 during write operation while CPMr is deactivated by CPM logic 102-2. In this example, a switch of Second Switch 104 coupled to bit-lines BLA[N] and BLB[N] for bit-cell 101-N is activated to re-route the Write B path from bit-line BLB[N] to bit-line BLA[N] because word-line WLB' is suppressed (i.e., deactivated) while word-line WLA' is active with an extended pulse. As such, Write B data is written to bit-cell 101-N using bit-line BLA[N] instead of bit-line BLB[N]. Since one word-line is active while the other is deactivated, write disturb to other bit-cells in the row is mitigated while data is successfully written to bit-cells 101-1 and 101-N as expected.

FIG. 7A illustrates a typical DP-SRAM 700 during a dual read operation that causes the disturb issue. It is pointed out that those elements of FIG. 7A having the same reference numbers (or names) as the elements of any other figure can operate or function in any manner similar to that described, but are not limited to such.

In traditional dual port memories (that do not have First and Second Switches 103 and 104, respectively, and associated logic), during a read operation to the same memory row, both word-lines WLA and WLB are activated (i.e., turned on) and appropriate column multiplexers of Colmux2 are turned on to read data from the selected bit-cells 101-1 and 101-N to Sense Amplifiers (SA) and then to respective dual read ports Port A and Port B.

In this case, the read data is provided through SA Ports A and B. Here, the two shaded paths (i.e., a light shaded path for reading by Port A and a dark shaded path for reading by Port B) show the electrical paths for reading data from the two selected bit-cells (i.e., bit-cell 101-1 and 101-N) of the row simultaneously. Since the word-lines WLA and WLB have pulses that overlap for a duration of time, the data read from Ports A and B can reduce the read margin and disturb data in other bit-cells of the same row. To mitigate this disturb issue, First Switch 103 is activated as shown with reference to FIG. 7B, according to some embodiments.

FIG. 7B illustrates a part of DP-SRAM of FIG. 5 during read write operation that mitigates the disturb issue, according to some embodiments of the disclosure. It is pointed out that those elements of FIG. 7B having the same reference numbers (or names) as the elements of any other figure can operate or function in any manner similar to that described, but are not limited to such.

In some embodiments, WLC logic 102-1 extends the pulse width of WLA' and suppresses word-line WLB' because word-lines WLA and WLB overlap for the same selected memory row and word-line WLB arrives after word-line WLA. In this example, word-line WLA' is highlighted indicating an activated word-line with an extended pulse, while word-line WLB' is suppressed as indicated by the light highlighted word-line WLB'.

In some embodiments, First Switch 103 is activated (i.e., turned on) because CPMr is activated by CPM logic 102-2 during read operation while CPMw is deactivated by CPM logic 102-2. In this example, switch of First Switch 103, which is coupled to bit-lines BLA[N] and BLB[N] of bit-cell 101-N, is activated to re-route the read path from bit-line BLA[N] to bit-line BLB[N] because word-line WLB' is suppressed (i.e., deactivated) while word-line WLA' is active with an extended pulse. This embodiment takes advantage of the design that both bit-lines coupled to the bit-cell 101-N can access the same data in that bit-cell. As such, data is read from bit-cell 101-N using bit-line BLA[N] instead of bit-line BLB[N]. Since one word-line is active while the other is deactivated, read disturb to other bit-cells in the same row is mitigated while data is successfully read from bit-cells 101-1 and 101-N as expected.

FIG. 8 illustrates flowchart 800 of a method for dual read and dual write operations such that disturb issue is mitigated, according to some embodiments of the disclosure. It is pointed out that those elements of FIG. 8 having the same reference numbers (or names) as the elements of any other figure can operate or function in any manner similar to that described, but are not limited to such.

Although the blocks in the flowchart with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 801, logic 102 determines whether first and second word-lines (WLs) are active for the same row of memory cells (i.e., whether word-lines WLA and WLB are active). In some embodiments, logic 102 determines whether the first and second WLs overlap during a duration of time (i.e., whether word-lines WLA and WLB overlap for a duration of time). If they do overlap, then at block 802, WLC logic 102-1 deactivates one of the later arriving word-lines while keeps the earlier arriving word-line active. For example, as illustrated with reference to FIG. 3A, word-line WLA is kept active while word-line WLB is deactivated. In this example, the two bit-cells of the same row being accessed are bit-cell 101-1 and bit-cell 101-N.

Referring back to FIG. 8, at block 803, CPM logic 102-2 determines whether the memory access operation is a read operation or a write operation. If the memory access operation is a read operation, then the process proceeds to blocks 804 or 805 depending on which word-line is suppressed and which is active. If the memory access operation is a write operation, then the process proceeds to blocks 807 or 808 depending on which word-line is suppressed and which is active.

For read operations, when data is being read from bit-cell 101-1 and bit-cell 101-N of the same memory row and when the second word-line (e.g., WLB') is suppressed, at block 804, CPMr is activated and CPMw is deactivated. As such, data from bit-cell 101-N is re-routed, by First Switch 103, from the first bit-line BLA[N] (of bit-cell 101-N) associated with the first read port (Port A) to the second bit-line BLB[N]) of bit-cell 101-N) associated with the second read port (Port B). During this read operation, data from bit-cell 101-1 is read using the first bit-line BLA[1] (of bit-cell 101-1) associated with the first read port (Port A). At block 806, the data from the bit-lines is received by the first and second SAs and the outputs of those SAs are provided to Port A and Port B.

For read operations, when data is being read from bit-cell 101-1 and bit-cell 101-N of the same memory row and when the first word-line (e.g., word-line WLA') is suppressed, at block 805, CPMr is activated and CPMw is deactivated. As such, data, read from bit-cell 101-1, on second bit-line (BLB[1]) associated with the second port B is re-routed to the first bit-line (e.g., BLA[1]) associated with the first port A when the first WL is deactivated. In another example, data from bit-cell 101-1 is re-routed, by First Switch 103, from the first bit-line BLA[1] (of bit-cell 101-1) associated with the first read port (Port A) to the second bit-line BLB[1]) of bit-cell 101-1) associated with the second read port (Port B). During this read operation, data from bit-cell 101-N is read using the first bit-line BLA[N] (of bit-cell 101-N) associated with the first read port (Port A). At block 806, the data from the bit-lines is received by the first and second SAs and the outputs of those SAs are provided to Port A and Port B.

For purposes of explaining the write operation, the first write port (Write A) drives data to be written to bit-cell 101-1 and the second write port (Write B) drives data to be written to bit-cell 101-N.

For write operations, when the two separate data are being written to bit-cell 101-1 and bit-cell 101-N of the same memory row and when the second word-line WLB' is suppressed, at block 807, CPMw is activated and CPMr is deactivated. As such, data driven from the second port (Write B), for the bit-cell 101-N, is re-routed by Second Switch 104 from the second bit-line BLB[N] (of bit-cell 101-N) to the first bit-line BLA[N]) of bit-cell 101-N). During this write operation, data driven from the first port (i.e., Write A) to bit-cell 101-1 is written using the first bit-line BLA[1] (of bit-cell 101-1). At block 809, the data to the bit-lines is received by bit-cells 101-1 and 101-N.

For write operations, when two separate data are being written to bit-cell 101-1 and bit-cell 101-N of the same memory row and when the first word-line WLA' is suppressed, at block 808, CPMw is activated and CPMr is deactivated. As such, data driven from the first write port (i.e., Write A), for the bit-cell 101-1, is re-routed by Second Switch 104 from the first bit-line BLA[1] (of bit-cell 101-1) to the second bit-line BLB[1]) of bit-cell 101-1). During this write operation, data driven by the second write port (i.e., Write B) to bit-cell 101-N is written using the first bit-line BLA[N] (of bit-cell 101-N). At block 809, the data to the bit-lines is received by bit-cells 101-1 and 101-N.

Figure 9:
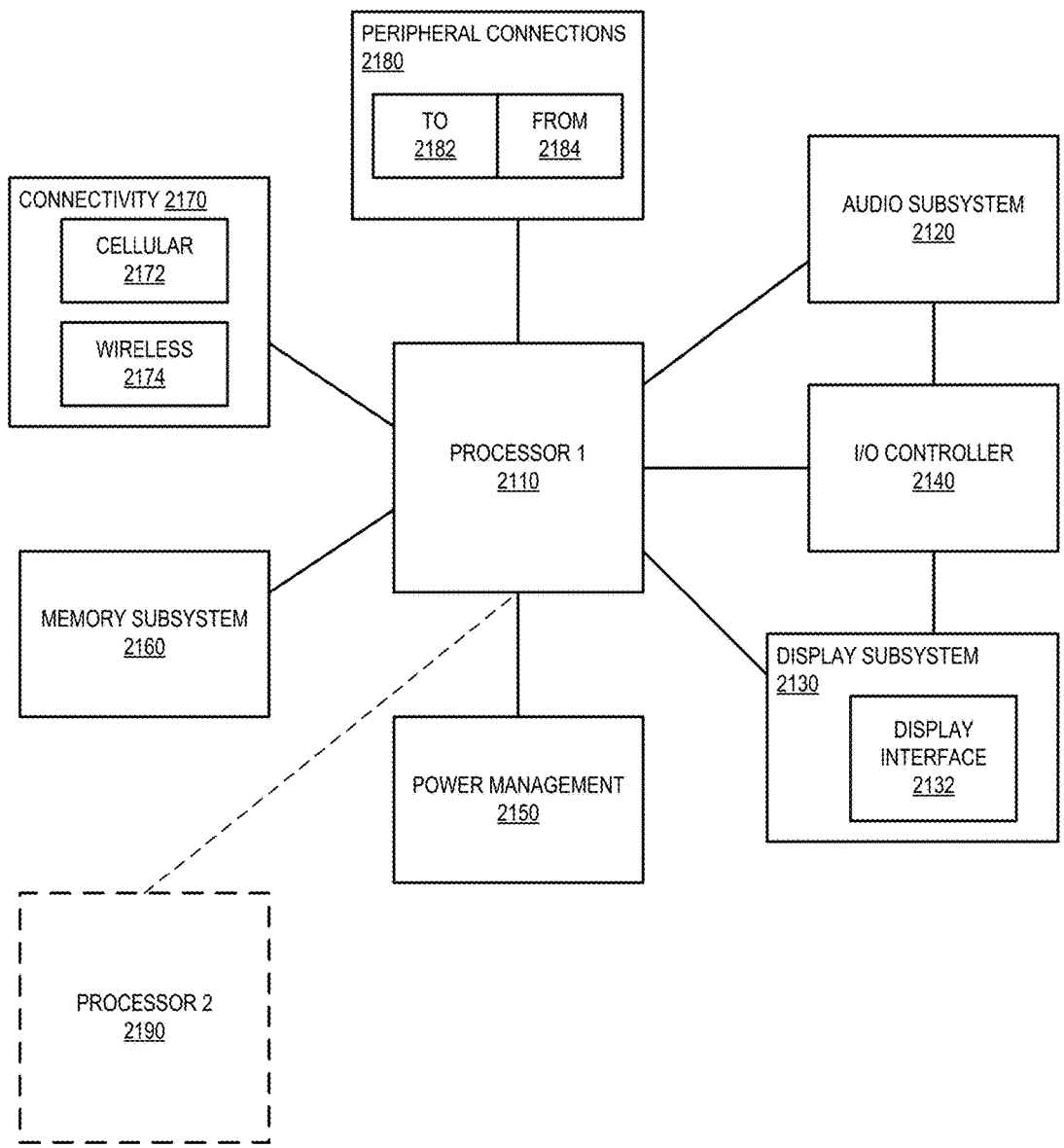
FIG. 9 illustrates a smart device or a computer system or a SoC (System-on-Chip) with the DP-SRAM and logic to mitigate the disturb issue, according to some embodiments.

FIG. 9 illustrates a smart device or a computer system or a SoC (System-on-Chip) with the DP-SRAM and logic to mitigate the disturb issue, according to some embodiments. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with the DP-SRAM and logic to mitigate the disturb issue, according to some embodiments discussed. Other blocks of the computing device 2100 may also include the DP-SRAM and logic to mitigate the disturb issue, according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. Memory subsystem 2160 may include the DP-SRAM and logic to mitigate the disturb issue, according to some embodiments.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a memory array; first logic to detect whether first and second word-lines (WLs) for a row of the memory array are active; and second logic to deactivate one of the first and second WLs such that one of the first and second WLs is active for the row. In some embodiments, the memory array includes memory bit-cells, at least one of which is accessible via at least first and second ports, and wherein the first port is associated with the first WL and the second port is associated with the second WL.

In some embodiments, the apparatus comprises a first switch which is operable to re-route data on bit-lines. In some embodiments, the first switch is operable to route data read from a bit-line associated with the first port to a bit-line associated with the second port when the second WL is deactivated. In some embodiments, the first switch is operable to route data read from a bit-line associated with the second port to a bit-line associated with the first port when the first WL is deactivated.

In some embodiments, the apparatus comprises a second switch which is operable to re-route data on bit-lines. In some embodiments, the second switch is operable to route data, to be written via a first write port, from one bit-line coupled to a memory bit-cell to another bit-line coupled to the memory bit-cell when the second WL is deactivated. In some embodiments, the second logic to deactivate one of the first and second WLs which arrived later relative to each other.

In some embodiments, the first logic to detect whether the first and second WLs for the row of the memory array are active simultaneously for at least a duration of time. In some embodiments, the apparatus comprises third logic which is operable to extend a pulse width of a signal of the active WL. In some embodiments, at least one of the first WL or second WL are generated asynchronously.

In another example, a system is provided which comprises: a processor; a multi-port memory coupled to the processor, the multi-port memory including an apparatus according to the apparatus described above; and a wireless device to allow the processor to communicate with another device.

In another example, a method is provided which comprises: detecting whether first and second word-lines (WLs) for a row of a memory array are active; and deactivating one of the first and second WLs such that one of the first and second WLs is active for the row. In some embodiments, the memory array includes memory bit-cells at least one of which is accessible via at least first and second read ports and first and second write ports, and wherein the first read and write ports are associated with the first WL and the second read and write ports are associated with the second WL.

In some embodiments, the method comprises routing data read from a bit-line associated with the first read port to a bit-line associated with the second read port when the second WL is deactivated. In some embodiments, the method comprises routing data read from a bit-line associated with the second read port to a bit-line associated with the first read port when the first WL is deactivated. In some embodiments, the method comprises routing data driven by the second write port, for a bit-cell, from a second bit-line to a first bit-line when the second WL is deactivated, wherein the first and second bit-lines are coupled to the first bit-cell. In some embodiments, deactivating one of the first and second WLs comprises suppressing one of the first and second WLs which arrived later relative to each other. In some embodiments, the method comprises extending a pulse width of a signal of the active WL from among the first and second WLs.

In another example, an apparatus is provided which comprises: means for detecting whether first and second word-lines (WLs) for a row of a memory array are active; and means for deactivating one of the first and second WLs such that one of the first and second WLs is active for the row. In some embodiments, the memory array includes memory bit-cells at least one of which is accessible via at least first and second read ports and first and second write ports, and wherein the first read and write ports are associated with the first WL and the second read and write ports are associated with the second WL.

In some embodiments, the apparatus comprises means for routing data read from a bit-line associated with the first read port to a bit-line associated with the second read port when the second WL is deactivated. In some embodiments, the apparatus comprises means for routing data read from a bit-line associated with the second read port to a bit-line associated with the first read port when the first WL is deactivated.

In some embodiments, the apparatus comprises means for routing data driven by the second write port, for a bit-cell, from a second bit-line to a first bit-line when the second WL is deactivated, wherein the first and second bit-lines are coupled to the first bit-cell. In some embodiments, the means for deactivating one of the first and second WLs comprises means for suppressing one of the first and second WLs which arrived later relative to each other. In some embodiments, the apparatus comprises means for extending a pulse width of a signal of the active WL from among the first and second WLs.

In another example, a system is provided which comprises: a processor; a multi-port memory coupled to the processor, the multi-port memory including an apparatus according to the apparatus described above; and a wireless device to allow the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a memory array;
   a first logic to detect whether first and second word-lines for a row of the memory array are active; and
   a second logic to deactivate one of the first and second wordlines such that one of the first and second wordlines is active for the row,
   wherein the memory array includes memory bit-cells, at least one of which is accessible via at least first and second ports, wherein the first port is associated with the first wordline and the second port is associated with the second wordline, and wherein the apparatus further comprises:
   a first switch coupled to first and second bit-lines associated with a memory bit-cell, wherein the first and second bit-lines are non-complementary bit-lines, wherein the first switch is operable to re-route data on the first and second bit-lines to the first and second ports, respectively,
   wherein the first logic is to detect whether the first and second wordlines are addressing a same row of the memory array,
   wherein the second logic is to determine whether the first and second wordlines have signals on them which overlap each other for at least a duration of time, and
   wherein the signal on the first or second wordlines which arrives later is suppressed while a pulse width of the signal on the first or second wordlines that arrives early is extended.

2. The apparatus of claim 1, wherein the first switch is operable to route data read from a bit-line associated with the first port to a bit-line associated with the second port when the second wordline is deactivated.

3. The apparatus of claim 1, wherein the first switch is operable to route data read from a bit-line associated with the second port to a bit-line associated with the first port when the first wordline is deactivated.

4. The apparatus of claim 1 comprises a second switch which is operable to re-route data on the first and second bit-lines to either the first and/or second ports or to the memory array.

5. The apparatus of claim 4, wherein the second switch is operable to route data, to be written via a first write port, from one bit-line coupled to a memory bit-cell to another bit-line coupled to the memory bit-cell when the second wordline is deactivated.

6. The apparatus of claim 1, wherein the second logic is to deactivate one of the first and second wordlines which arrived later relative to each other.

7. The apparatus of claim 1, wherein the first logic is to detect whether the first and second wordlines for the row of the memory array are active simultaneously for at least a duration of time.

8. The apparatus of claim 1 comprises third logic which is operable to extend a pulse width of a signal of the active wordline.

9. The apparatus of claim 1, wherein at least one of the first wordline or second wordline are generated asynchronously by a circuit.

10. A method comprising:
   detecting whether first and second word-lines for a row of a memory array are active; and
   deactivating one of the first and second wordlines such that one of the first and second wordlines is active for the row,
   wherein the memory array includes memory bit-cells at least one of which is accessible via at least first and second read ports and first and second write ports, and wherein the first read and write ports are associated with the first wordline and the second read and write ports are associated with the second wordline, and wherein the method comprises:
      routing data read from a bit-line associated with the first read port to a bit-line associated with the second read port when the second wordline is deactivated, wherein a first switch is coupled to first and second bit-lines associated with a memory bit-cell, wherein the first and second bit-lines are non-complementary bit-lines, wherein the first switch is operable to re-route data on the first and second bit-lines of the memory bit-cell to the first and second read ports, respectively;
      detecting whether the first and second wordlines are addressing a same row of the memory array;
      determining whether the first and second wordlines have signals on them which overlap each other for at least a duration of time;
      suppressing the signal on the first or second wordlines which arrives later; and
      extending a pulse width of the signal on the first or second wordlines that arrives early.

11. The method of claim 10 comprises routing data read from a bit-line associated with the second read port to a bit-line associated with the first read port when the first wordline is deactivated.

12. The method of claim 10 comprises routing data driven by the second write port, for a first bit-cell, from a second bit-line to a first bit-line when the second wordline is deactivated, wherein the first and second bit-lines are coupled to the first bit-cell.

13. The method of claim 12, wherein deactivating one of the first and second wordlines comprises suppressing one of the first and second wordlines which arrived later relative to each other.

14. A system comprising:
   a processor;
   a multi-port memory coupled to the processor, the multi-port memory including:
      a memory array;
      a first logic to detect whether first and second word-lines for a row of the memory array are active; and
      a second logic to deactivate one of the first and second wordlines such that one of the first and second wordlines is active for the row;
      wherein the memory array includes memory bit-cells, at least one of which is accessible via at least first and second ports, wherein the first port is associated with the first wordline and the second port is associated with the second wordline, and wherein the multi-port memory further comprises:
      a first switch coupled to first and second bit-lines associated with a memory bit-cell, wherein the first and second bit-lines are non-complementary bit-lines, wherein the first switch is operable to re-route data on the first and second bit-lines of the memory bit-cell to the first and second ports, respectively;
      wherein the first logic is to detect whether the first and second wordlines are addressing a same row of the memory array,
      wherein the second logic is to determine whether the first and second wordlines have signals on them which overlap each other for at least a duration of time, and
      wherein the signal on the first or second wordlines which arrives later is suppressed while a pulse width of the signal on the first or second wordlines that arrives early is extended; and
   a wireless device to allow the processor to communicate with another device.

15. The system of claim 14, wherein the first logic is to detect whether the first and second wordlines for the row of the memory array are active simultaneously for at least a duration of time, and wherein the second logic is to deactivate one of the first and second wordlines which arrived later relative to each other.

16. The apparatus of claim 1, wherein the first switch is operable to re-route data, independent of a sense amplifier, on the first and second bit-lines to either the first and/or second ports or to the memory array.

17. The apparatus of claim 1, wherein the first switch is operable to re-route data on the first and second bit-lines to the memory array.

18. The apparatus of claim 1, wherein data in the memory array, associated with one of the first or second wordlines which is suppressed, is retrieved via the first or second wordline having a signal which is not suppressed.

19. An apparatus comprising:
   circuitry to detect whether first and second word-lines for a row of a memory array are active; and
   circuitry to deactivate one of the first and second wordlines such that one of the first and second wordlines is active for the row,
   wherein the memory array includes memory bit-cells at least one of which is accessible via at least first and second read ports and first and second write ports, and wherein the first read and write ports are associated with the first wordline and the second read and write ports are associated with the second wordline, and wherein the apparatus comprises:
      means for routing data read from a bit-line associated with the first read port to a bit-line associated with the second read port when the second wordline is deactivated, wherein a first switch is coupled to first and second bit-lines associated with a memory bit-cell, wherein the first and second bit-lines are non-complementary bit-lines; and means for re-routing data on the first and second bit-lines of the memory bit-cell to the first and second read ports, respectively.

\* \* \* \* \*